US005690997A

United States Patent [19]

Grow

[11] Patent Number: 5,690,997
[45] Date of Patent: Nov. 25, 1997

[54] CATALYTIC CARBON—CARBON DEPOSITION PROCESS

[75] Inventor: Dana T. Grow, Grand Forks, N. Dak.

[73] Assignee: Sioux Manufacturing Corporation, Fort Totten, N. Dak.

[21] Appl. No.: 437,508

[22] Filed: May 9, 1995

Related U.S. Application Data

[63] Continuation of Ser. No. 131,989, Oct. 4, 1993, abandoned.
[51] Int. Cl.[6] .................................................. C23C 16/00
[52] U.S. Cl. ...................... 427/249; 927/226; 927/255.1
[58] Field of Search ............................... 427/249, 255.1, 427/226; 118/716

[56] References Cited

U.S. PATENT DOCUMENTS

| | | |
|---|---|---|
| 4,497,788 | 2/1985 | Bradley et al. . |
| 4,565,684 | 1/1986 | Tibbetts et al. . |
| 4,572,813 | 2/1986 | Arakawa . |
| 4,749,557 | 6/1988 | Yetter et al. . |
| 4,770,867 | 9/1988 | Coulon et al. . |
| 4,836,898 | 6/1989 | Noyes . |
| 4,876,078 | 10/1989 | Arakawa et al. . |
| 4,900,483 | 2/1990 | Witzke et al. . |
| 4,911,781 | 3/1990 | Fox et al. . |
| 4,970,123 | 11/1990 | Witzke et al. . |
| 5,039,504 | 8/1991 | Kageyama et al. . |
| 5,045,356 | 9/1991 | Uemura et al. ........................ 427/249 |
| 5,077,130 | 12/1991 | Okuyama et al. ..................... 428/408 |
| 5,093,156 | 3/1992 | Uemura et al. ........................ 427/249 |
| 5,171,560 | 12/1992 | Tennent . |
| 5,210,116 | 5/1993 | Hashimoto et al. . |

FOREIGN PATENT DOCUMENTS

| | | |
|---|---|---|
| 61-275425 | 12/1986 | Japan . |
| 61-282425 | 12/1986 | Japan . |
| 62-282020 | 12/1987 | Japan . |
| 63-282313 | 11/1988 | Japan . |
| 3014623 | 1/1991 | Japan . |
| 3019920 | 1/1991 | Japan . |
| 4-235741 | 8/1992 | Japan . |

OTHER PUBLICATIONS

Baker et al., "Formation of Filamentous Carbon from Iron, Cobalt and Chromium Catalyzed Decomposition of Acetylene", *Journal of Catalysis*, 30, 86–95 (1973) No month available.

Baker et al., "The Formation of Filamentous Carbon", *Chemistry and Physics of Carbon*, 14, 83–165 (1978) No month available.

Bianchini et al., "Kinetic Implications of Mechanisms Proposed for Catalytic Carbon Filament Growth", *Journal of Catalysis*, 117, 455–466 (1989) No Month Available.

Downs et al., "Mixed Carbon Fiber–Carbon Filament Preforms for a New Generation of Advanced Composites", *Nineteenth Biennial Conference on Carbon Jun. 25–30, 1989 (Extended Abstracts and Program)*, 268–269 (1989) No month available.

Downs et al., "Novel Carbon Fiber–Carbon Filament Structures", *Carbon*, 29, 1173–1179 (1991) No month available.

Dresselhaus et al., *Graphite Fibers and Filaments*, pp. 10–11, 16, 19–30, 42–45, 236–239, 341–359 (1988) No month available.

Grow et al., "A Report on the Research Performed Under the Rosensweig Grant", *Journal of Magnetism and Magnetic Materials*, 122, 343–348 (1993) No month available.

Grow, "A Catalytic CVD Process for Carbon—Carbon Composites," Abstract presented at the 40th International SAMPE Symposium and Exhibition, May 8–11, 1995.

"Make Carbon—Carbon in Hours", *High–Tech Materials Alert*, 11:1, 3 (1994). No month available.

"Textron Unit Attempting to Make Composite Brake Material Less Expensive", *The Weekly of Business Aviation*, 57:25, 259 (1993). No month available.

"Rapidly Densified Carbon—Carbon Looks Commercial", *Advanced Manufacturing Technology*, 14:12, 10 (1993). No month available.

"ARPA Textron Composite Process", *Flight International*, 144:4400, 24 (1993). No month available.

"Textron to Make Composite Aircraft Brake Material More Affordable", *Aerospace Daily*, 168:38, 332 (1993). No month available.

"Affordable Composites", *Aviation Week & Space Technology*, 140:1, 13 (1994). (as provided by Lexis) No month available.

"Awards, Contrasts" *High–Performance Composites*, Jan/Feb:10 (1994). No month available.

Alstrup, "A New Model Explaining Carbon Filament Growth on Nickel, Iron and Ni–Cu Alloy Catalysts", *Journal of Catalysis*, 109, 241–251 (1988) No month available.

Baker, "Carbon Formation on Supported Metal Catalysts", *Mat. Res. Soc. Symp. Proc.*, 111, 41–48 (1988) No month available.

Baker, "Catalytic Growth of Carbon Filaments", *Carbon*, 27, 315–323 (1989) No month available.

Lund et al., "Solid–State Diffusion During Carbon Gasification and Filament Growth", *Carbon*, 27, 956–958 (1989) No month available.

McAllister et al., "Ni–Catalyzed Carbon Infiltration of Carbon–Fiber Substrates", *Carbon*, 30, 189–200 (1992) No month available.

Safvi et al., "The Dependence of Catalytic Carbon Filament Growth Kinetics Upon Gas Phase Carbon Activity", *Carbon*, 29, 1245–1250 (1991) No month available.

(List continued on next page.)

*Primary Examiner*—Shrive Beck
*Assistant Examiner*—Brian K. Talbot
*Attorney, Agent, or Firm*—Merchant, Gould, Smith, Edell, Welter & Schmidt, P.A.

[57] ABSTRACT

A chemical vapor deposition process for production of strong and heat resistant carbon-containing composite materials is disclosed. The process comprises providing a porous substrate, loading the porous substrate with a catalyst, exposing the catalyst-loaded substrate to a heated atmosphere comprising a hydrocarbon and a carrier gas, and rapidly decomposing the hydrocarbon onto the catalyst-loaded substrate.

16 Claims, No Drawings

OTHER PUBLICATIONS

Tibbetts, "Lengths of Carbon Fibers Grown from Iron Catalyst Particles in Natural Gas", *Journal of Crystal Growth*, 73, 431–438 (1985) No month available.

Tibbetts et al. "An Adsorption–Diffusion Isotherm and its Application to the Growth of Carbon Filaments on Iron Catalyst Particles", *Carbon*, 25, 367–375 (1987) No month available.

Vandeberg et al., "Air–Stability of Methane–Treated Carbon Fibres", *Journal of Materials Science Letters*, 9, 1475–1477 (1990) No month available.

Yang et al., "Mechanism of Carbon Filament Growth on Metal Catalyts", *Journal of Catalysis*, 115, 52–64 (1989) No month available.

Zielinski et al., "The use of Magnetite as a Catalyst for the Chemical Vapor Deposition of Carbon on Carbon Fibers", *Proceedings of the North Dakota Academy of Science*, 45, (1991) No month available.

Zielinski et al., "An Iron Catalyst for CVD of Methane on Carbon Fibers", *Carbon*, 30, 295–299 (1992) No month available.

Zielinski et al., "An Iron catalyst for CVD of Methane on Carbon Fibers", Carbon 30, pp. 295–299 Mar. 1992.

McAllister et al., "Ni–catalyzed Carbon Infiltration of Carbon–Fiber Substrates", Carbon 30, pp. 189–200 Mar. 1992.

CATALYTIC CARBON— CARBON DEPOSITION PROCESS

The present application is a continuation of U.S. Application Ser. No. 08/131,989, which was filed on Oct. 4, 1993 and is now abandoned.

The present invention was made with the support of government funding from the United States Department of Defense Small Business Innovation Research (SBIR) Program, topic number SDIO 92-013. The government has certain rights in this invention.

FIELD OF THE INVENTION

The present invention relates to composite materials. In particular, it concerns production of composite materials comprising a carbon matrix, by chemical vapor deposition processing.

BACKGROUND OF THE INVENTION

In many applications and operations materials are exposed to extreme temperatures. Materials that can withstand extreme temperatures and large fluctuations in temperature while maintaining their shape and structural integrity in very hot and/or cold environments are preferred in these types of applications. Moreover, some applications also may command relatively lightweight structural materials.

For example, materials frequently exposed to high temperature furnace and tunnel environments, such as heating elements, must retain their shape and structural integrity in extreme temperatures. Materials comprising missile nosecones and exhaust nozzles should not, of course, deteriorate before the missiles arrive at their targeted destinations.

Similarly, the leading edges of airplane wings should withstand high speed movement and winds without losing their shape or structural integrity. Materials comprising disc brakes in airplane braking systems should resist deterioration under the intense heat generated by the friction involved in stopping an airplane. Also, radiation panels for electronic equipment on space satellites require materials that are light weight and have a high thermal conductivity.

Typically, composite materials are used in these types of applications. Combining two materials into one composite allows advantage to be taken of the useful properties of each material. Composites used in applications such as those described above typically comprise an open or porous substrate and a matrix or filler within the porous substrate. The substrate is the skeleton or framework of the composite. The matrix is the material that fills openings in the substrate.

Composites that comprise a carbon substrate and a carbon matrix have been successfully used as heat shields, because both the substrate and the matrix have approximately the same coefficient of thermal expansion and because such composites are strong and stable, even when exposed to temperatures on the order of 1200° C. Moreover, carbon materials in general maintain their shape and structural integrity while conducting heat away from a heat generating source, since they have a relatively high thermal conductivity. In addition, carbon-carbon (C—C) materials are, typically, relatively lightweight by comparison to alternate structural materials so they frequently are used in high temperature applications that require strong, lightweight, materials. For example, C—C materials have been used as aircraft or missile components.

Composite materials comprising a carbon matrix have been prepared in a variety of ways. One method of preparation is by impregnating a substrate with a phenolic resin, and then repeatedly pyrolyzing the impregnated substrate to form a composite.

A second conventional process for preparing composite materials comprising a carbon matrix involves decomposition of a hydrocarbon gas onto a substrate through a chemical vapor deposition process. In such a process, the composite is formed by filling the substrate with a matrix of carbon, which is liberated during decomposition of the hydrocarbon gas.

In such a chemical vapor deposition process, the porous substrate is exposed to a gas under conditions that decompose the gas into carbon and hydrogen. As the gas decomposes, the liberated carbon fills the void spaces in and around the substrate. With time, a carbon matrix develops in and around the substrate, and a composite material is formed.

In the past, the creation of composite materials by either one of the two conventional methods described has been relatively inefficient. Using such techniques, thousands of hours of processing time can be required to obtain a material that is sufficiently loaded with the carbon matrix to be both sufficiently strong and heat resistant to withstand extreme temperature applications. Therefore, efforts have been focused on the development of methods to accelerate the chemical vapor deposition process. Many of these methods utilize catalysts to accelerate chemical vapor deposition processing.

Usually electron donors, such as metals, are effective catalysts for hydrocarbon decomposition processes. Transition metals have typically been preferred. Nickel and iron-based catalysts have been used in many applications.

Use of an iron-based catalyst was disclosed, for example, in Carbon, 30:2 (1992), in which, Richard Zielinski et al. describe a chemical vapor deposition process that uses carbon fibers as the carbon substrate, methane gas as the source of carbon for the matrix, and magnetite ($Fe_3O_4$) particles as the catalyst. Magnetite particles were shown to increase the rate of deposition of carbon onto the substrate in an atmosphere comprising methane and nitrogen gases.

Although catalysts have been used to accelerate the rate of carbon deposition during a chemical vapor deposition process for making composite materials containing a carbon matrix, after eight hours of conventional processing using catalysts, the resulting composite materials typically still have a significant amount of void space. This significant amount of void space in the resulting carbon-containing material indicates that the substrate exhibited a less than optimal mass increase during chemical vapor deposition processing. Thus, conventional processing using catalysts has not been fully acceptable.

SUMMARY OF THE INVENTION

The present invention provides a process for production of a carbon-loaded composite. In one preferred embodiment, the process comprises loading carbon into a porous substrate, which contains an initial or first void fraction, by chemical vapor deposition of carbon from a hydrocarbon gas until: at least 25% of the first void fraction of the porous substrate is carbon loaded; and a void fraction of no greater than 0.30 is obtained in the resulting carbon-loaded composite. According to this embodiment, the carbon is loaded by chemical vapor deposition at a rate such that both of the following are achieved within six hours: 1) at least 25% of the first void fraction is carbon-loaded; and 2) a void fraction of no greater than 0.30 in a resulting carbon-loaded composite is obtained. Void fraction is defined as the fraction of volume that is empty space in the substrate. For example, a carbon substrate that has a 0.30 void fraction contains 70% carbon by volume and 30% void space by volume. Although the rate of deposition is defined such that 1) and 2) are achieved within six hours, the deposition process of this embodiment of the present invention is not required to be conducted in less than six hours. For this embodiment, the rate of carbon deposition (loading) during chemical vapor deposition is a variable used to define the chemical vapor deposition process, and time is a variable in the rate definition. Thus, for example, the deposition can be conducted for a period of eight hours, provided that the rate of deposition is such that within the first six hours of loading, at least 25% of the initial void fraction is filled, and a void fraction of no greater than 0.30 is obtained. However, in preferred applications of this embodiment, useful products result even when chemical vapor deposition is conducted in six hours or less, preferably four hours or less. Indeed it is an advantage of preferred processes according to the present invention that such short loading times can be used, while obtaining useful products.

In preferred applications, during chemical vapor deposition, carbon is loaded into a porous substrate that is loaded with a catalyst selected from the group consisting essentially of: nickel-containing catalysts, iron-containing catalysts and mixtures thereof. The catalyst accelerates decomposition of the hydrocarbon gas during the chemical vapor deposition of carbon. The porous substrate is preferably selected from carbon, ceramic or fiberglass materials. A fibrous carbon substrate is preferred. The carbon fiber substrate preferably comprises fibers of microfilaments. In preferred applications, the initial void fraction of the porous substrate is preferably at least 0.40 and no greater than 0.70.

Typically, the chemical vapor deposition of carbon will comprise exposing the catalyst-loaded substrate to an environment (for example the inside of a furnace), which is heated to at least 950° C., while passing a gaseous mixture consisting essentially of a hydrocarbon gas and a carrier gas through the catalyst-loaded substrate. Preferably, the catalyst-loaded substrate comprises a porous carbon substrate, such as carbon fibers, with an initial void fraction of 0.45 to 0.55, loaded with 22–27%, by weight, magnetite catalyst particles.

Preferably, the catalyst particles, on average, have a largest dimension (e.g. diameter for spherical particles) of 70 Angstroms to 100 Angstroms. The term, on average, is meant to indicate that some particles may have a largest dimension of larger than 100 Angstroms or smaller than 70 Angstroms, but the average of the particles' largest dimensions should be within the range.

The heated environment comprises a gaseous mixture, in a preferred embodiment, consisting essentially of methane and a carrier gas. The gaseous mixture of methane gas and the carrier gas, preferably has a methane gas to carrier gas ratio, by volume, within the range of 1:1 to 1:2. Inert gases, hydrogen, or mixtures thereof are the most preferred carrier gases. Upon completion of the chemical vapor deposition, a resulting composite, according to the present invention, should have a void fraction no greater than 0.30.

A process for production of a carbon-loaded composite according to the present invention can be defined in terms of the porous carbon substrate's initial void fraction, the porous carbon substrate's mass increase during carbon loading of the substrate, and the resulting composite's void fraction. A preferred process according to the present invention and so defined comprises loading carbon into a porous carbon substrate by chemical vapor deposition of carbon from a hydrocarbon gas; wherein the porous carbon substrate has a first void fraction of at least 0.40 and not greater than 0.70. The carbon is loaded into the porous carbon substrate until: at least 25% of the first void fraction of the porous carbon substrate is carbon loaded; a mass increase of the porous carbon substrate of at least 50% is achieved; and, a void fraction of 0.30 is exhibited in the resulting carbon-loaded composite.

Herein, the term mass increase is meant to refer to the percent that the substrate mass increases during carbon loading. For example, a substrate that doubles its weight during carbon deposition processing exhibits a 100% mass increase. Mass increase is generally inversely proportional to the amount of void space remaining in the composite material. As mass increases void space decreases, and as void space decreases, the material's strength and heat resistance increase.

A process according to the present invention, can also be defined in terms of process parameters, the rate at which carbon is deposited upon the catalyst-loaded substrate, and the mass increase of a porous carbon substrate. According to such a definition, preferably, a porous carbon substrate is loaded with 22–27% by weight magnetite catalyst, which on average contains particles with a largest dimension of 70 Angstroms to 100 Angstroms. The rate of carbon deposition, preferably, is such that both of the following are obtained within a time period of deposition of no greater than six hours: 1) at least 25% of the porous carbon substrate's first void fraction is carbon-loaded; and 2) a void fraction of a resulting carbon-loaded composite of 0.30 is obtained. Again, the process need not be completed within six hours; rather, the rate of loading should be such that the results described are achieved within six hours. In this embodiment, the chemical vapor deposition preferably comprises exposing the catalyst-loaded substrate to an environment, which is heated to at least 950° C., while passing a gaseous mixture consisting essentially of methane gas and a carrier gas through the catalyst-loaded substrate. The gaseous mixture of methane gas and carrier gas, preferably, has a methane gas to carrier gas ratio, by volume, within the range of 1:1 to 1:2. During the chemical vapor deposition processing of this embodiment, the porous carbon substrate, preferably, will exhibit a mass increase of at least 50% and no greater than 70%, and the resulting composite will have a void fraction of no greater than 0.30.

In another embodiment, the process of the present invention, can be defined in terms of the initial void fraction of the porous carbon substrate, the rate of carbon deposition, and the mass increase exhibited by the porous carbon substrate. In this embodiment, the initial carbon substrate void fraction is at least 0.40 and not greater than 0.70; at least 25% of the first void fraction of the porous carbon substrate is loaded; and a mass increase of at least 50% is obtained. Moreover, the rate of carbon deposition is such that both of the following are achieved within a time period of carbon deposition not greater than six hours: 1) filling at least 25% of the first void fraction and 2) obtaining a resulting carbon-loaded composite with a void fraction no greater than 0.30. The process, in accordance with this embodiment of present invention, may or may not be conducted within a time period of carbon deposition of six hours. The time period is provided, again, as a means of defining rate of deposition.

In yet a further embodiment, the process according to the present invention can be defined by an initial carbon substrate void fraction, carbon deposition process parameters, and the rate of carbon deposition. In this embodiment, the initial void fraction of the substrate is at least 0.45 and no greater than 0.55, and at least 25% of the first void fraction of the carbon substrate is loaded with carbon. The process and its parameters include: loading the porous carbon substrate with 22–27% by weight magnetite catalyst, which comprises particles having, on average, a largest dimension within the range of 70 Angstroms to 100 Angstroms, distributed thereon; and exposing this catalyst-loaded substrate to an environment, which is heated to at least 950° C., while passing a gaseous mixture consisting essentially of methane gas and a carrier gas through the carbon-loaded substrate. The gaseous mixture of methane gas and carrier gas, preferably, has a methane gas to carrier gas ratio, by volume, within the range of 1:1 to 1:2. The rate of carbon deposition, in this embodiment, is defined such that both of the following are obtained within a time period of carbon deposition of not greater than six hours: at least 25% of the porous carbon substrate's first void fraction is carbon-loaded; and, the resulting carbon-loaded composite exhibits a void fraction of no greater than 0.30. The process, in accord with this embodiment of the present invention may or may not be conducted for a period of deposition exceeding six hours. Again, the six hour time period is used to define rate of deposition.

In another embodiment, the process can be defined by the initial void fraction of the carbon substrate, carbon deposition process parameters, and the carbon substrate's mass increase. The initial void fraction of the porous carbon substrate, preferably, is at least 0.45 and not greater than 0.55, and the mass increase exhibited by the porous carbon substrate during carbon deposition is at least 40%. The process and its parameters include: loading the porous carbon substrate with 22–27% by weight magnetite catalyst, comprising magnetite particles having, on average, a largest dimension within the range of 70 Angstroms to 100 Angstroms, distributed thereon; and exposing the catalyst-loaded substrate to an environment, which is heated to 950° C., while passing a gaseous mixture consisting essentially of methane gas and a carrier gas through the carbon-loaded substrate. The gaseous mixture of methane gas and carrier gas has a methane gas to carrier gas ratio, by volume, within the range of 1:1 to 1:2. In addition, at least 25% of the first void fraction of the porous carbon substrate is loaded, in accordance with this embodiment.

In yet another embodiment, the process is defined by the void fraction of the resulting carbon-loaded composite, the mass increase of the carbon substrate, and carbon deposition process parameters. The resulting carbon-loaded composite, preferably, has a void fraction not greater than 0.30, and the carbon substrate exhibits a mass increase of at least 40% and no greater than 100%. Moreover, at least 25% of the first void fraction of the porous carbon substrate, preferably, is carbon loaded. The carbon deposition process and its parameters, preferably, include: loading the porous carbon substrate with 22–27%, by weight, magnetite catalyst, comprising magnetite particles having, on average, a largest dimension within the range of 70 Angstroms to 100 Angstroms, distributed thereon; and exposing the catalyst-loaded porous substrate to an environment, which is heated to at least 950° C., while passing a gaseous mixture consisting essentially of methane gas and a carrier gas through the carbon-loaded substrate. The gaseous mixture of methane gas and carrier gas preferably has a methane gas to carrier gas ratio, by volume, within the range of 1:1 to 1:2.

DETAILED DESCRIPTION OF THE INVENTION

The present invention is directed to a process for producing carbon-containing composite materials. A carbon-containing composite material of the present invention will be formed using a chemical vapor deposition process. This process involves: providing a substrate, loading a catalyst onto the substrate to form a catalyst-loaded substrate, and depositing, by chemical vapor deposition, elemental carbon onto the catalyst-loaded substrate to form a carbon-loaded substrate. In a typical application, the step of chemical vapor deposition comprises decomposition of a hydrocarbon gas as it passes through the catalyst-loaded substrate in a heated environment.

Providing the Substrate

In composite materials made according to the present invention, the substrate provides a skeleton or framework, which defines the shape of the resulting composite. In general, the substrate should comprise a porous construction. Preferably, the substrate has a porosity or void fraction not less than 0.40 and not greater than 0.70. Most preferably, the void fraction of the substrate is not less than 0.40 and not greater than 0.60. In typical applications, according to the present invention, the void fraction of the substrate will be about 0.45 to 0.55. In general, if the void fraction is too low, insufficient carbon loading for good composite characteristics will result, and if the void fraction is too high, there may be an insufficient substrate presence to ensure the integrity of the resulting composite.

Porosity or void fraction of the substrate or a composite can be measured by any means known in the art. Preferably, the void fraction is measured using a standard penetration technique. For example, using a porosimeter, a known volume of mercury may be forced into a substrate or composite under high pressure. The loss of volume in the mercury is equivalent to the volume of void space in the substrate or composite. Therefore, the void fraction can be calculated by dividing the total substrate or composite volume (including the void space) into the volume of void space.

In general, preferred substrates, for the processes of the present invention, will be those which are: sufficiently flexible to be shaped as dictated by particular applications to which the composite is to be directed; sufficiently structurally sound to withstand extreme temperatures during carbon composite material formation; and sufficiently conducive to containing an effective amount of catalyst. More specifically, preferred substrates comprise materials which are: capable of being retained in a selected shape throughout the composite formation process without unacceptable loss of structural integrity; sufficiently strong to maintain structural integrity while being exposed to the conditions of the carbon deposition process; and capable of supporting a sufficient amount of metal catalyst to conduct the process efficiently.

There are a variety of materials that exhibit these aforementioned characteristics, and thus, from which the substrate can be formed. These materials include ceramics, fiberglass, and carbon. Typically, a substrate will comprise one or more of these materials in a filament or fiber form, and the filaments or fibers can be provided in any shape or form that a particular application requires; for example as a woven form or in a non-woven mat, such as a felt. When the substrate comprises a woven or non-woven mat, a composite of a selected shape can be created by putting the substrate on a shaping stand or form, which is made of a material that can withstand the elevated temperatures to which it will be exposed during the chemical vapor deposition process. Alternatively, individual sticks or bundles of fibers can be configured to comprise a substrate.

As will be described in more detail below, decomposing hydrocarbon compounds in relatively high temperatures (at least 600° C. and typically 825° C. to 1030° C.) in the presence of a metal catalyst is the preferred method for forming a matrix for a carbon-containing composite. Therefore, the substrate should comprise a construction and material that will retain its structural configuration under exposure to such conditions. In addition, during the hydrocarbon decomposition or carbon deposition, the substrate contains a metal catalyst. In the immediate vicinity of the catalyst, very high temperatures can develop. Thus, the substrate should comprise a construction and material that will not unacceptably lose its integrity in the vicinity of the catalyst, during hydrocarbon decomposition or carbon loading. Fibrous substrates (comprising fibers containing many microfilaments) will be preferred, since even if some microfilaments are damaged by high local heating, fiber integrity (and thus substrate integrity) is not lost, and the microfilaments can facilitate dissipation of heat with less damage.

In preferred processes according to the present invention, carbon substrates, formed from carbon fibers, will be used. There are a wide variety of fibrous carbon materials useable in forming carbon-containing composites. Typically, those comprising 5000 to 7000 filaments (each about 5–20 microns in diameter) will be preferred since: many filaments provide nesting spaces for catalyst particles and deposited carbon particles. Moreover, if any given filament happens to break, structural integrity will not be lost when thousands of filaments are providing support to the substrate.

Preferably, fibers comprising at least 90% carbon, by weight, and most preferably, at least 92% carbon are used. Carbon fibers comprising at least 90% carbon are commercially available from Amoco Performance Products in Atlanta, Ga. and Hercules, Inc. in Magna, Utah. Alternatively, carbon fibers, useable in processes in accord with the present invention, may be formed from rayon, pitch or polyacrylonitrile (PAN) filaments. Preparation of carbon fibers generally involves conventional oxidation and pyrolysis of rayon, pitch, or PAN filaments to form fibers that are at least 90% carbon.

The useable types of fibrous material, in processes according to the present invention, include fibers exhibiting broad ranges of physical properties, such as elongation, fiber density, tensile strength, filament diameter, number of filaments per strand, and amount of carbon. The preferred amount of elongation the fiber should exhibit can be varied depending on application. Elongation is the amount of axial stretch a fiber exhibits prior to breaking. The fibers according to the present invention should exhibit sufficient elongation to withstand the tensile stress and shear forces to which the resulting composite will be exposed. However, the fibers should not exhibit so much elongation that they do not provide a structurally stable substrate. A typical carbon fiber elongation for commercially available carbon fibers is 1–2%, and fibers exhibiting such an elongation will be acceptable in typical applications of composites made according to the present invention.

The preferred fiber density can also be varied in accordance with particular applications. Applications that require strong composite materials typically will require use of fibers (within the composite) with a high fiber density. A typical carbon fiber density for commercially available carbon fibers is 1.6–1.8 g/cc; and fibers exhibiting such a fiber density are useable in processes according to the present invention.

In general, fibrous materials used in processes according to the present invention should exhibit sufficient tensile strength to withstand the forces to which the composite will be exposed, without breaking. Commercially available carbon fibers typically have a tensile strength of 400,000–600,000 psi; and such fibers can be used in typical applications in accordance with the present invention.

The appropriate filament diameter and number of filaments per strand for each application will depend upon the size, shape and structural configuration of the substrate for each application. In general, an application can require a few large diameter filaments per strand, or an application can require thousands of small diameter filaments per strand. Selection of these properties depends upon the stresses and weights to which the carbon containing composite will be subjected. Typically, commercially available carbon fibers contain about 5000–12000 filaments per strand and have a filament diameter of about 5–20 microns. Such fibers are generally useable in processes according to the present invention.

Sizing can be used on the fibrous substrate in order to facilitate handling and retention of substrate size and shape. The sizing may comprise a long chain alcohol, such as polyvinyl alcohol. In general, without sizing carbon fibers can deform during shipping and handling. Commercially available carbon fibers containing 0.75–0.9 wt % sizing can be used in processes according to the present invention.

Loading of the Catalyst

Typically, in processes in accord with the present invention, a catalyst is loaded onto the substrate to accelerate carbon matrix formation. In general, the catalyst accelerates carbon matrix formation by facilitating the decomposition of hydrocarbon gas and uniform deposition of carbon throughout the substrate during the chemical vapor deposition process.

A variety of types of catalysts can be used in the formation of composite materials containing a carbon matrix. Also, for any given catalyst various sizes of catalyst particles can be used. Preferably, the catalyst comprises a material that: can withstand the conditions of the chemical vapor deposition process without undesirable decomposition or degradation; which facilitates decomposition of the hydrocarbon gas into hydrogen and carbon at an efficient rate; and which can be relatively evenly and effectively distributed throughout a porous substrate.

In general, metal-containing catalysts are preferred because metals are typically electron donors that can facilitate decomposition of a hydrocarbon. In typical applications, catalysts containing transitional metals are most preferred. These types of metal catalysts include the following nickel-based or iron-based catalysts: nickel, iron, $Fe(CO)_5$, ferrocene, stainless steel, $Fe(NO_3)_3$, magnetite, nickel-copper, nickel-palladium and mixtures thereof. Catalysts that do not require activation prior to use, such as magnetite, are most preferred.

In general, a variety of sizes and shapes of catalyst particles can be used in accordance with the present invention. However, if the catalyst particles are too large, fewer catalyst sites will result in the substrate, for a given weight percent catalyst loading. With fewer catalyst sites, there will be fewer locations within the substrate at which the accelerated hydrocarbon decomposition reaction will be conducted. If the catalyst particles are too small, hydrocarbon decomposition reactions can be inhibited within a short time after the hydrocarbon decomposition is initiated, because very small catalyst particles can become too rapidly engulfed in the liberated carbon before carbon loading is complete. An appropriate catalyst particle size for typical applications, is in part dependent upon the size and shape of the substrate in a particular application. Moreover, the amount of void space in a substrate can be a factor in defining the optimum catalyst particle size for a particular application. However, in general, catalyst particles that have on average a largest dimension on the order of 60 Angstroms to 100 Angstroms will be useful in processes according to the present invention. When magnetite is used as the catalyst, particles that have a largest dimension, on average, from about 70 Angstroms to about 100 Angstroms will be preferred. Preferably, at least 90% of the catalyst particles, by weight, are of a size less than 100 Angstroms (largest dimension).

The catalyst can be loaded onto a carbon substrate in any manner suitable for relatively evenly distributing the catalyst throughout the substrate. Metal catalysts are commercially available in a variety of forms, for example, as powders and suspensions. Powdered catalysts can be loaded by submerging the substrate in the powder.

Metal catalysts suspended in liquids can be loaded by a liquid evaporation process. Typically, for such a process, the substrate is submerged in a liquid suspension of catalyst, or the liquid suspension can be applied to the substrate. Once the substrate is coated with a liquid suspension, the liquid is driven off by any suitable means that allows the catalyst particles to remain on the substrate. For example, heat and/or vacuum treatment may be used to drive off the liquid. This loading process (comprising applying the liquid suspension to the substrate and driving off the liquid) can be repeated until a selected and desired amount of catalyst is loaded onto the substrate.

Typically, if too much catalyst is added to the substrate, then the composite's mechanical properties can deteriorate due to void spaces in the resulting composite. Moreover, if too little catalyst is added to the substrate, processing time is undesirably increased. The amount of catalyst to be loaded onto the substrate can be expressed as a weight percent increase over an initial weight of the substrate. An optimum or desired weight percent increase can be determined by taking into consideration the type of catalyst, the amount of void space in the substrate, the desired amount of reaction time, and the amount of hydrocarbon to which the catalyst and substrate will be exposed.

In general, if a substrate contains a relatively large amount of void space, then a high rate of reaction can be required to fill that void space. Thus, in order to obtain an extensive matrix in a relatively short time period, for a substrate having relatively high void space, a large amount of catalyst would be required to accelerate matrix formation. In general, if a substrate contains a relatively small amount of void space, then less catalyst, typically, would be required to fill the void space in a short time period.

Moreover, a desired reaction time for a particular application can also be a factor in determining the amount of catalyst to load onto the substrate. In general, more catalyst particles are required for a short residence time, and less catalyst particles are required for a long residence time. In addition, an amount of hydrocarbon gas to which the substrate is exposed during deposition, typically is an important factor in determining the amount of catalyst to load. If an amount of hydrocarbon gas to which a carbon substrate will be exposed during a chemical vapor deposition process is to be minimized, then it can be unnecessary, in most applications, to load a large amount of catalyst. Alternatively, if the amount of hydrocarbon gas to which a substrate will be exposed is to be in excess, then other factors, in typical applications, control the preferred amount of catalyst to load.

For exemplary purposes, the following is a detailed description of a catalyst loading process that would be useable. A PAN-based carbon fiber substrate, Amoco T-300, from Amoco Performance Products is provided. This fiber substrate has an elongation of 1.5%, a fiber density of 1.764 g/cc, a tensile strength of 512,000 psi, a sizing of 0.82% by weight, a filament diameter of 7 microns, a carbon assay of 92% and 6000 filaments per strand. The substrate has a void fraction of about 0.5 (i.e. about 50% of the substrate volume is void space and 50% is carbon fibers). Magnetite particles 70–100 Angstroms in diameter and suspended in a liquid, are selected as the catalyst. This catalyst is sold as ferrofluid and is obtained from Ferrofluidics, Inc. of Nashua, N.H. The ferrofluid catalyst comprises either magnetite particles suspended in water (EMG 805) or a mineral oil (EMG 905). A solvent, such as hexane, if the mineral oil suspension is selected, can be used to dilute the ferrofluid suspension.

The substrate is immersed in the ferrofluid. After the fibers are immersed, the system is heated until the fluid evaporates, leaving the metal particles loaded on the substrate. This immersion and evaporation process is repeated until the desired amount of catalyst is loaded.

The desired amount of reaction time for the chemical vapor deposition is four hours or less, and an excess amount of hydrocarbon gas will be exposed to the fibers during the chemical vapor deposition process. Therefore, in order to manufacture a carbon composite material, the magnetite particles should be loaded until the weight of the carbon fiber substrate increases approximately 20% to 30%. Preferably, the carbon fiber substrate is repeatedly loaded with metal particles until there has been about a 26% increase in its weight.

In a typical process of loading catalyst, the initial weight of the carbon fibers is recorded, and the substrate is weighed after each loading cycle in order to determine how much catalyst is loaded. A loading cycle, for this example, consists of immersing the carbon fiber structure into a fluid containing a metal catalyst, evaporating the fluid, and weighing the substrate to measure the weight increase. Once a sufficient amount of catalyst is loaded, the substrate may be shaped, and then it is ready to undergo chemical vapor deposition processing, during which the carbon matrix forms on and around the substrate.

The substrate can be shaped before or after the loading of the catalyst. A substrate within the scope of the present invention can be shaped or preformed to accommodate many applications. Moreover, the substrate, typically, can be selected to maintain its shape and structural integrity for the life of the composite material.

The substrate, if sufficiently flexible, may, for example, be put on a shaping stand made of a material that can withstand elevated temperatures, and be shaped to almost any geometrical configuration. In order to comprise a nosecone of a rocket, for example, the substrate can be shaped into a conical configuration. Moreover, a porous or fibrous substrate can be bundled together like a bunch of sticks or configured into two and three dimensional objects. A carbon substrate can be configured, for example, to comprise radiators for electronic equipment on space satellites or brakes on an aircraft.

Depositing the Carbon Matrix onto the Substrate

During chemical vapor deposition processing, hydrocarbon gases decompose into hydrogen and carbon, and the substrate void space is filled with the liberated carbon. In general, when void space in the substrate decreases, the resulting composite's strength and heat resistance increases. Density of the resulting composite and mass increase(%) of the substrate, are indicators of the amount of void space in the resulting composite.

Mass increase can be defined as the percent increase in weight of the substrate after carbon deposits in its pores, forming a matrix. For example, if a substrate is a carbon substrate and has an initial void fraction of 0.5, then typically, a 100% mass increase (i.e. with the resulting composite weighing twice as much as the substrate) indicates that all of the substrate's void space is filled (since the substrate and matrix for a carbon fiber substrate have essentially the same density).

A substrate with an initial void fraction of between 0.40 and 0.70 is preferred, and a composite with a final void fraction no greater than 0.30 is preferred. Therefore, if the substrate is carbon, preferred mass increases are between 25% and 130%. More specifically, a substrate with an initial void fraction of between 0.40 and 0.60 is most preferred, and a composite with a final void fraction no greater than 0.20 is most preferred. Therefore, if the substrate is carbon, most preferred mass loadings are not less than about 30% and not greater than about 100%.

Typical chemical vapor deposition processing involves subjecting the catalyst-loaded substrate to a heated environment containing a hydrocarbon gas. The temperature should be such that upon contact with the catalyst-loaded substrate, the hydrocarbon gas will decompose into carbon and hydrogen. The heated environment can be provided by a variety of methods. For example, the substrate can be placed in a furnace. A Lindberg tube furnace (which can provide a 1200° C. environment) may be used for relatively small substrates. Such a furnace is available from Fisher Scientific of Pittsburgh, Pa. as model number 10-472-73. An induction furnace may be used for larger substrates.

Preferably, the temperature of the gases during the deposition will be between 870° C. and 1030° C. Most preferably, the heated environment is between 900° C. and 1050° C.

In typical processes, a carrier gas is used to carry the hydrocarbon gas molecules to the catalyst-loaded substrate. A variety of carrier gases can be used. In order to efficiently facilitate movement of the hydrocarbon gas molecules to the catalyst-loaded substrate, the carrier gas should be of a type that does not react (with the hydrocarbon gas) in the heated environment. Thus, preferably, air is excluded from the deposition process. Preferably, hydrogen and inert gases (such as helium, argon, nitrogen, neon, or mixtures of them) and mixtures thereof are used. Hydrogen gas, nitrogen gas and mixtures thereof are most preferred.

Hydrocarbon gas flow can be initiated through the air-deficient heated environment after carrier gas flow. In general, a hydrocarbon that can decompose into hydrogen and carbon in a 825° to 1030° C. atmosphere is preferred for chemical vapor deposition processes according to the present invention. For example, ethane, ethylene, methane, benzene, and hexane gases are useable.

In general, a variety of hydrocarbon flow rates can be used in the chemical vapor deposition process. However, if the hydrocarbon gas flow rate is too low, matrix formation is slowed; and, if the hydrocarbon gas flow rate is too high, an excess of hydrocarbon gas will develop. The excess hydrocarbon gas can be wasted by flowing through the heated environment without decomposing. A flow rate between 150 and 250 standard cubic centimeters/minute is preferred for a smaller substrate, such as one that weighs one to two grams.

Once inside the heated and air-deficient environment, the hydrocarbon gas quickly diffuses through the carrier gas and onto the surface of the substrate or a catalyst particle. Once the hydrocarbon gas is on the particle surface, it can be adsorbed and desorbed from the surface and then decompose into carbon and hydrogen.

In typical processes, liberated carbon then deposits upon the surface of the substrate. Generally, the rate of hydrocarbon decomposition will be slower than the rate of carbon deposition from a catalyst particle onto the substrate. Therefore, in general, the hydrocarbon decomposition reaction controls the rate of carbon matrix formation.

There are several variables that can affect the rate of hydrocarbon decomposition. One of these variables can be the amount (number of particles) of catalyst that is loaded onto the substrate. Each catalyst particle can provide a reaction site for the decomposition of hydrocarbon gas. Therefore, in general, a small number of catalyst particles indicates that there will be a small number of sites at which the hydrocarbon can decompose quickly. In typical processes, a larger number of catalyst particles indicates that there will be a larger number of sites at which the hydrocarbon can decompose quickly. However, if there are too many catalyst particles, the mechanical properties of the composite can be unsatisfactory for some applications.

The availability of the hydrocarbon gas for decomposition in proportion to the amount of carrier gas in the heated environment can be another variable that controls the rate of hydrocarbon decomposition. If the hydrocarbon gas flow rate is substantially higher than the carrier gas flow rate, then the hydrocarbon molecules will diffuse more slowly to a surface of the substrate or catalyst particles. If the hydrocarbon gas flow rate is substantially lower than the carrier gas flow rate, then the carrier gas can be wasted because there would be an excess amount of carrier gas in the heated environment.

In processes in which the partial pressure of the heated environment needs adjustment, the hydrocarbon gas flow rate can be substantially lower than the carrier gas flow rate, and the carrier gas flow can be modified to attain the desired partial pressure within the heated environment.

In accordance with the present invention, a hydrocarbon flow rate of 150 to 250 standard cubic centimeters per minute and a carrier gas flow rate of 150 to 250 standard cubic centimeters per minute are preferred for smaller substrates. The proportion of hydrocarbon gas to carrier gas within the heated environment can be expressed as the hydrocarbon/carrier gas flow ratio. In accordance with the present invention, a hydrocarbon/carrier gas flow ratio range of 1:1 to 1:11 is preferred. A ratio range of 1:1 to 1:2 is most preferred for applications with relatively small substrates, and a ratio range of 1:9 to 1:11 will be most preferred for commercial applications.

A third variable affecting the rate of carbon deposition is time. Even if no catalyst is used, enough decomposition reactions will eventually occur in order to form a carbon matrix on the substrate. However, the time period for decomposition would be too long. In preferred applications of the present invention, relatively short periods of deposition (six hours or less) are all that are needed.

A fourth variable affecting the rate of carbon deposition is temperature. In general, at lower temperatures the rate of deposition is lower, and at higher temperatures the rate is faster. However, above about 1250° C. the rate may not increase enough to justify the heating expense. Below about 700° C. the rate of carbon deposition is too slow to maximize process efficiency. Preferably the temperature of the heated environment in which the carbon deposition takes place, is no greater than about 1050° C. and is not less than about 900° C.

In particular, by optimizing a variety of process variables, a relatively strong and lightweight carbon-loaded composite can be formed in a time period not greater than six hours.

These process variables include: the type of material comprising the substrate; the initial void fraction of the substrate; the amount, size and type of catalyst loaded onto the substrate; the temperature and composition of the heated environment in which hydrocarbon decomposition and carbon deposition occur; and the void fraction of the resulting composite. In preferred embodiments, the carbon substrate's initial void fraction is at least 0.45 and not greater than 0.55, and the substrate is loaded with 22–27% by weight magnetite catalyst particles having, on average, a largest dimension of at least 70 Angstroms and not greater than 100 Angstroms. Preferably, the catalyst-loaded substrate is then exposed to an environment, which is heated to at least 950° C., while passing a gaseous mixture consisting essentially of methane gas and a carrier gas through the catalyst-loaded substrate. In a preferred embodiment, the rate of carbon deposition is such that both of the following are achieved within six hours: 1) at least 25% of the first void fraction is carbon-loaded; and 2) a void fraction of no greater than 0.30 is obtained in a resulting composite.

Preferably, the resulting composite of the present invention is produced within six hours and has a void fraction of no greater than 0.3 and a density of 1.7–1.9 g/cm³. In general, the composite will be sufficiently strong, light weight and heat resistant to withstand many high temperature applications. The resulting composite can be machined or buffed to specification, for example, as a nosecone or brake component.

EXAMPLES

The invention is described in more detail with reference to the following examples, which are not intended to restrict the scope of the invention.

In each of the examples, the following procedure was performed:

PAN based carbon fibers (Amoco T-300) were wrapped in a bundle, weighed and placed in a stainless steel sample holder. These carbon fibers have a 1.5% elongation, a 1.764 g/cc fiber density, 512,000 psi tensile strength, a Young's modulus of 34,100,000 psi, 0.82 wt-% sizing, a 7 micron filament diameter, a 92% carbon assay, a 0.45 m²/g surface area, and 6000 filaments per strand.

The sample holder was constructed from 0.5" OD alloy 600 stainless steel. Ferrofluid catalyst was loaded onto the carbon fibers. Using appropriate two-stage regulators, a furnace inlet was connected to methane and nitrogen tanks. The sample holder was placed inside a Vesuvius McDanel, MV30-1614-40, mullite combustion tube with a 3.8 cm O.D. and a 101.6 cm length. The flow of a carrier gas, preferably nitrogen, through the furnace was initiated. The mullite combustion tube was placed into a hot zone of a Lindberg tube furnace, and the hydrocarbon gas flow through the furnace was initiated.

The furnace temperature was controlled by a programmable controller. A Fisher Scientific, 10-549-115B, was used in these examples. A Fisher Scientific microburner (model 04-067N) can be attached to the outlet of the furnace in order to burn excess gases and avoid releasing a high concentration of methane. The following table displays the various mass increases obtained in a variety of times with particular temperatures, and catalyst loadings:

| T(°C.) | Loading (%) | Time (hr) | Mass Increase (%) |
|--------|-------------|-----------|-------------------|
| 977 | 0 | 7 | 21 |
| 977 | 6.3 | 7 | 44 |
| 977 | 6.8 | 7 | 41.6 |
| 977 | 10.3 | 3.5 | 44.3 |
| 977 | 23.4 | 3.5 | 92 |
| 977 | 26.6 | 2.75 | 100 |
| 977 | 27.1 | 3.5 | 73 |
| 977 | 26.3 | 0.5 | 16.3 |
| 977 | 26.3 | 1.0 | 52.2 |
| 977 | 26.3 | 1.5 | 76 |
| 977 | 26.3 | 2.0 | 84 |
| 952 | 22.6 | 0.5 | 6.8 |
| 952 | 22.6 | 1 | 19.2 |
| 952 | 22.6 | 1.5 | 39.8 |
| 952 | 22.6 | 2 | 61.5 |
| 952 | 22.6 | 2.5 | 70.5 |
| 1002 | 23.6 | 0.5 | 41.5 |
| 1002 | 23.6 | 1 | 72.2 |
| 1002 | 23.6 | 1.5 | 81.6 |
| 977 | 0 | 0.5 | 0.5 |
| 977 | 0 | 1 | 2.1 |
| 977 | 0 | 1.5 | 3.6 |
| 977 | 0 | 2 | 5.5 |
| 977 | 0 | 2.5 | 8.1 | methane flow rate = 185 sccm
nitrogen flow rate = 200 sccm

What is claimed is:

1. A process for production of a carbon-loaded composite; said process comprising steps of:
  (a) loading carbon into a porous substrate;
    (i) the porous substrate having a first void fraction wherein the first void fraction is 0.70 or greater;
    (ii) said step of loading carbon being a loading only by chemical vapor deposition of carbon from methane gas and being conducted at a rate of carbon loading such that:
      1) at least 25% of the first void fraction is carbon-loaded, and a void fraction, of a resulting carbon-loaded composite, of 0.30 is achieved, within a time period of chemical vapor deposition of not greater than six hours; and
    (iii) the porous substrate having a nickel-based or iron-based catalyst thereon in an amount of at least about 22% by weight and not greater than about 27% by weight: and
  (b) conducting said step of loading carbon until both:
    (i) at least 25% of the first void fraction of the porous substrate is loaded; and
    (ii) a void fraction of no greater than 0.30 is obtained in the resulting carbon-loaded composite.

2. A process according to claim 1 wherein said step of loading carbon by chemical vapor deposition is conducted for a period of deposition not greater than four hours.

3. A process according to claim 1 wherein:
  (a) said step of loading carbon into a porous substrate comprises loading carbon into a substrate comprising material selected from the group consisting essentially of: fiberglass, carbon, ceramics and mixtures thereof.

4. A process according to claim 3 wherein:
  (a) said step of loading carbon into a porous substrate comprises loading carbon into a substrate comprising a fiber material.

5. A process according to claim 1 wherein:
  (a) said step of loading carbon into a porous substrate comprises loading carbon into a carbon-fiber substrate.

6. A process according to claim 1 wherein:
  (a) said step of loading carbon into a porous substrate comprises loading carbon into a carbon fiber substrate wherein the carbon fiber substrate comprises fibers of microfilaments.

7. A process for production of a carbon-loaded composite; said process comprising steps of:
  (a) loading carbon into a porous carbon substrate;
    (i) the porous carbon substrate having a first void fraction of at least 0.45 and not greater than 0.55;
    (ii) the porous carbon substrate further including 22–27% by weight magnetite catalyst, comprising magnetite particles having, on average, a largest dimension within the range of 70 Angstroms to 100 Angstroms, distributed thereon; and
  (b) conducting said step of loading carbon only by chemical vapor deposition of carbon from a methane gas at least until both:
    (i) at least 25% of the first void fraction of the porous carbon substrate is carbon-loaded; and
    (ii) a void fraction of no greater than 0.30 is obtained, within a time period of deposition of not greater than 6 hours, in a resulting carbon-loaded composite; and
  (c) said chemical vapor deposition comprising exposing the porous carbon substrate to an environment which is heated to at least 950° C. while passing a gaseous mixture consisting essentially of methane gas and a carrier gas through the porous carbon substrate; the gaseous mixture of methane gas and carrier gas having a methane gas to carrier gas ratio, by volume, within the range of 1:1 to 1:2.

8. The process according to claim 7 wherein:
  (a) said step of chemical vapor deposition comprises exposing the catalyst-loaded substrate to said gaseous mixture consisting essentially of methane gas and the carrier gas hydrogen.

9. The process according to claim 7 wherein:
  (a) said step of chemical vapor deposition comprises exposing the catalyst-loaded substrate to said gaseous mixture consisting essentially of methane gas and the carrier gas consisting essentially of an inert gas or mixtures thereof.

10. The process according to claim 7 wherein:
  (a) said step of loading carbon into a porous carbon substrate by chemical vapor deposition of carbon from the gas comprises loading carbon into a porous carbon fiber substrate comprised of fibers of microfilaments.

11. A process for production of a carbon-loaded composite; said process comprising steps of:
  (a) loading carbon into a porous carbon substrate;
    (i) the porous carbon substrate having a first void fraction, wherein the first void fraction is 0.70 or greater;
    (ii) the porous carbon substrate further including 22–27% by weight magnetite catalyst, comprising magnetite particles having, on average, a largest dimension within the range of 70 Angstroms to 100 Angstroms, distributed thereon; and
    (iii) said step of loading carbon being a loading only by chemical vapor deposition of carbon from a methane gas and being conducted at a rate of carbon loading such that:
      1) at least 25% of the first void fraction is carbon-loaded and
      2) a void fraction, of a resulting carbon-loaded composite, of 0.30 is achieved, within a time period of deposition of no greater than six hours;
  (b) conducting chemical vapor deposition until both:
    (i) at least 25% of the first void fraction of the porous carbon substrate is loaded; and
    (ii) a mass increase of the porous carbon substrate of at least 50% is obtained; and
  (c) said chemical vapor deposition comprising exposing the porous carbon substrate to an environment which is heated to at least 950° C. while passing a gaseous mixture consisting essentially of methane gas and a carrier gas through the porous carbon substrate; the gaseous mixture of methane gas and carrier gas having a methane gas to carrier gas ratio, by volume, within the range of 1:1 to 1:2.

12. A process according to claim 11 wherein said step of loading carbon is conducted for a period of deposition exceeding six hours.

13. A process according to claim 11 wherein said step of loading carbon by chemical vapor deposition is conducted for a period of deposition not greater than four hours.

14. A process for production of a carbon-loaded composite; said process comprising steps of:
  (a) loading carbon into a porous carbon substrate;
    (i) the porous carbon substrate having a first void fraction of at least 0.40 and no greater than 0.70;
    (ii) said step of loading carbon being a loading only by chemical vapor deposition of carbon from a methane gas and being conducted at a rate of carbon loading such that:
      1) at least 25% of the first void fraction is carbon-loaded and a void fraction, of a resulting carbon-loaded composite, of 0.30 is achieved, within a time period of deposition of no greater than six hours; and
    (iii) the porous substrate having a nickel-based or iron-based catalyst thereon in an amount of at least 22% by weight and not greater than about 27% by weight; and
  (b) conducting said step of loading carbon until:
    (i) at least 25% of the first void fraction of the porous substrate is loaded; and
    (ii) a mass increase of the porous carbon substrate of at least 50% is obtained.

15. A process according to claim 14 wherein said step of loading carbon by chemical vapor deposition is conducted for a period of deposition exceeding six hours.

16. A process for production of a carbon-loaded composite; said process comprising steps of:
  (a) loading carbon into a porous carbon substrate;
    (i) the porous carbon substrate having a first void fraction of at least 0.45 and no greater than 0.55;
    (ii) the porous carbon substrate further including 22–27% by weight magnetite catalyst, comprising magnetite particles having, on average, a largest dimension within the range of 70 Angstroms to 100 Angstroms, distributed thereon; and
  (b) conducting said step of loading carbon only by chemical vapor deposition of carbon from a methane gas until:
    (i) at least 25% of the first void fraction of the porous carbon substrate is carbon loaded; and
    (ii) a mass increase of the porous carbon substrate of at least 50% is obtained; and
  (c) said chemical vapor deposition being performed within a time period of deposition of not greater than 6 hours and comprising exposing the porous carbon substrate to an environment which is heated to at least 950° C. while passing a gaseous mixture consisting essentially of methane gas and a carrier gas through the carbon-loaded substrate; the gaseous mixture of methane gas and carrier gas having a methane gas to carrier gas ratio, by volume, within the range of 1:1 to 1:2.

* * * * *

UNITED STATES PATENT AND TRADEMARK OFFICE
CERTIFICATE OF CORRECTION

PATENT NO. : 5,690,997

DATED : NOVEMBER 25, 1997

INVENTOR(S) : GROW

It is certified that error appears in the above-identified patent and that said Letters Patent is hereby corrected as shown below:

On the title page, item:

[56] References Cited, U.S. Patent Documents: please insert

— 4,212,906  7/1980  Fisher et al. .................................. 427/237

4,582,751  4/1986  Vasilos et al. ................................ 428/307.3

4,894,286  1/1990  Gray ............................................. 428/408

5,202,158  4/1993  Sakagami et al. ............................. 427/185

5,312,679  5/1994  Wolf et al. .................................... 428/289—

Signed and Sealed this

Twenty-sixth Day of January, 1999

Attest:

Attesting Officer

*Acting Commissioner of Patents and Trademarks*